United States Patent
Cowan et al.

(10) Patent No.: US 6,505,324 B1
(45) Date of Patent: Jan. 7, 2003

(54) AUTOMATED FUSE BLOW SOFTWARE SYSTEM

(75) Inventors: Bruce Cowan, Essex Junction, VT (US); Frank O. Distler, Williston, VT (US); Mark F. Ollive, Milton, VT (US); Michael R. Ouellette, Westford, VT (US); Jeannie H. Panner, Underhill, VT (US); Dora R. Pealer, Jericho, VT (US); Bruce D. Raymond, Pleasant Valley, NY (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 09/680,340

(22) Filed: Oct. 5, 2000

(51) Int. Cl.$^7$ .............................................. G06F 17/50
(52) U.S. Cl. .......................................... 716/4; 714/736
(58) Field of Search ...................... 716/1, 4; 714/725, 714/733, 735, 737, 736

(56) References Cited

U.S. PATENT DOCUMENTS

| | | | | |
|---|---|---|---|---|
| 5,610,829 A | * | 3/1997 | Trimberger | 716/16 |
| 5,796,750 A | * | 8/1998 | Lottridge et al. | 714/725 |
| 5,825,785 A | * | 10/1998 | Barry et al. | 714/726 |
| 5,912,901 A | * | 6/1999 | Adams et al. | 714/733 |
| 5,961,653 A | * | 10/1999 | Kalter et al. | 714/30 |
| 5,983,009 A | * | 11/1999 | Lepejian et al. | 714/733 |
| 6,081,910 A | * | 6/2000 | Mifsud et al. | 714/718 |

* cited by examiner

Primary Examiner—John F. Niebling
Assistant Examiner—Stacey Whitmore
(74) Attorney, Agent, or Firm—McGinn & Gibb, PLLC; Richard M. Kotulak, Esq.

(57) ABSTRACT

It is, therefore, an object of the present invention to provide a structure and method of blowing fuses in a semiconductor chip that includes creating a design for the chip using a library, generating test data from the design, extracting the fuse related information from the design to prepare a fuse blow table, building the chip with the design data, testing the chip to produce failed data, comparing the fuse blow table to the failed data to determine the fuse blow location data, and blowing the selected fuses based on the fuse blow location data. The extraction method can include creating a fuse map file based upon a correlation between physical pin locations on the chip and different fuse macros within the design, wherein an order of fuses within the fuse blow table matches an order of fuses within the fuse map file.

27 Claims, 6 Drawing Sheets

| Orientation | 1 | 2 | 3 | 4 | 5 | 6 | 7 | 8 |
|---|---|---|---|---|---|---|---|---|
| Chg X,Y → | +X,+Y | -X,+Y | +X,-Y | -X,-Y | +Y,+X | -Y,+X | +Y,-X | -Y,-X |
| VIM Mirror | No | Yes | Yes | No | Yes | No | No | Yes |
| Rotate | 0 | 180 | 0 | 180 | 90 | 90 | 270 | 270 |

(Mirror about x-axis first, then rotate in counter-clockwise direction)

AUTOMATED FUSE BLOW SOFTWARE SYSTEM

BACKGROUND OF THE INVENTION

1. Field of the Invention

The present invention generally relates to integrated circuit manufacturing and more particularly to a process of blowing fuses within a semiconductor device.

2. Description of the Related Art

An application specific integrated circuit (ASIC) might contain some number of dense syncronous random access memory (SRAM) macros, an electronic chip identification (ECID) macro, and some number of embedded dynamic random access memory (eDRAM) macros, all of which contain laser fuses. The automated process for conversion of test data to fuseblow x-y locations needs to be flexible enough to handle various constraints imposed by the diverse nature of the ASIC business. ASIC designs are quite varied with respect to utilization of these types of macros.

The devices on the chip (e.g., SRAM, eDRAM, etc.) are tested, preferably using a built-in self test (BIST) design. Upon detection of a defect, select fuses are blown to permanently logically disconnect the defective devices from the circuit. Commonly these defective devices are replaced with redundant devices (again by selectively blowing fuses).

An example of a typical ASIC design is shown in FIG. 1. The example in FIG. 1 has five SRAM macros 100–104, 2 eDRAM macros 105, 106 and an ECID macro 108. The SRAMs in this example are tested from two separate multiple-array-built-in-self-test (MABIST) controller macros, A (110) and B (111). Fuses for the SRAM macros reside in separate FUSE macros 112–116, as shown. The BIST design 120, 121 and FUSES 122, 123 for eDRAM macros 105, 106 are included within each eDRAM macro. The ECID macro 108 contains fuses 109 but is different, in that the values to be blown reflect non-test related data (chip identification data).

The SRAM macros 100–104 and eDRAM macros 105, 106 are similar, in that test data is used to determine which fuses need to be blown. These macros differ in the complexity associated with correlating test measurements to desired fuse blow x-y locations. The SRAM macros 100–104 use external MABIST controllers 110, 111 to measure the test data, and an external fuse macro 114, 115 to which the test data must be correlated. The BIST logic 120, 121 and fuses 122, 123 for the eDRAMs 105, 106 are self-contained. As a result, the SRAM macros 100–104 need to have net-tracing performed to assist the test to physical x-y correlation, whereas the eDRAM macros 105, 106 do not.

The ECID (electronic chip identification) macro is used to encode Lot#, Wafer ID, Chip X-Y, etc. This data is created from software which uses this information as an input. This information is later used to identify a module and enable a correlation to the manufacturing process in-line data and wafer final test data.

The conventional laser fuse blow process includes steps which are manually performed for each different part number that requires laser fuse blow. The designer and/or product engineer will manually extract the information needed for laser fuse blow from the test manufacturing data (TMD 208) and physical data or Very-Large-Scale-Integration (VLSI) In-core Model (VIM).

As the laser tool sweeps over the fuses, corresponding measured logical "1" latch data will direct the laser tool to pulse the laser beam, thereby blowing the desired fuse as dictated by the test data. The actual correspondence between measured latches and specific fuse x-y loactions must be specified in a correspondence list.

In the TMD, certain latches are specified to be measured during test. Some of these latches contain stored failing address locations and redundancy enable bits which specify that certain redundant rows or columns within a certain array on the chip must be selected. These latches must be identified manually by reading the TMD and listing them in the correspondence list according to the name specified for them within the TMD. These measured values will correspond to actual fuses within the chip that must be blown using a laser beam. Which fuses are blown will depend upon which of the above specified latches are measured at a logical value of "1".

Also, the physical locations of the fuses with respect to the chip (0,0) coordinate must be provided to the laser tool, so that it knows where to point the laser beam. In the VIM, macros containing fuses are identified by manually reading the VIM to find them. As previously mentioned, there are various types of macros containing fuses. If the macro is a fuse macro for SRAMs, then further tracing of the nets within the VIM is necessary in order to find the fuse macro's corresponding MABIST controller. Once this is known, then the latch name within the MABIST controller can be found in the correspondence list, which was generated when reading the TMD. The correspondence of fuses within the fuse macro and latches within the corresponding MABIST controller can then be specified in the correspondence list. The x-y coordinates of the fuses within the fuse macro are manually transposed to chip level coordinates, and these chip level coordinates are manually entered in the correspondence list next to the fuse's corresponding latch. A similar operation is performed for eDRAM macros, although the extra tracing within the VIM isn't necessary, since the BIST latches and the fuses exist within the same macro, and the correspondence is fixed within the macro. The fuse x-y coordinates for the eDRAM fuses must also be manually transposed to chip x-y coordinates and manually added to the correspondence list. For the ECID macro, the fuse x-y coordinates are manually listed in a specified order in the correspondence list next to a manually specified indentifier. There are no latches measured in the TMD for ECID. The manual steps involved in creating the correspondence list are laborious and time consuming. Errors are easily made and very difficult to debug when the laser fuse blow fails.

The product engineer for the specified part number will manually read the TMD and the VIM to create the correspondence list. This list is then provided to the fuse software engineer, who manually codes a fuse blow table (FBT) specific to that part number. The manual steps involved in creating the FBT are very prone to error. Once this FBT is debugged, the fuse mapping software will automatically convert tester data for each chip to fuseblow data. However, this FBT must be manually created and debugged for each different part number.

SUMMARY OF THE INVENTION

It is, therefore, an object of the present invention to provide a structure and method of blowing fuses in a semiconductor chip including creating a design for the chip using a library, generating test data from the design, extracting the fuse related information from the design to prepare a fuse blow table, building the chip with the design data, testing the chip to produce failed data, comparing the fuse blow table to the failed data to determine the fuse blow location data, and blowing the selected fuses based on the fuse blow location data.

The extraction method can include creating a fuse map file based upon a correlation between physical pin locations on the chip and different fuse macros within the design, wherein an order of fuses within the fuse blow table matches an order of fuses within the fuse map file. Creation of the fuse map file includes categorizing the fuse macros, flattening hierarchy in the design, and progressively matching the fuse macros in the design to the physical pin locations using a fuse location file.

Each fuse macro has a unique fuse location file and creation of the fuse map file also includes converting the fuse location information in each fuse location file such that the fuse location information is relative to the semiconductor chip as a whole by noting individual fuse macro locations, mirroring, and orientation. Blowing of selected fuses includes matching the fuse map file to a wafer map. The fuse location file includes keywords that identify an associated fuse macro, a type of fuse algorithm to be used with the associated fuse macro, and fuse locations relative to a center of the associated fuse macro.

Testing of the semiconductor chip can also include creating a fuse map file based upon a correlation between physical pin locations on the chip and different fuse macros within the design, creating a fuse blow table based upon a correlation between latches on the chip and fuses in the fuse map file, testing the chip to produce data in the latches, matching the latches having defective data with the fuses using the fuse blow table, wherein defective devices in the chip will produce defective data in the latches, and blowing selected fuses based upon the fuse blow table to logically disconnect defective devices and logically connect spare devices as a means of repair in the semiconductor chip.

The invention can also include a system for testing a semiconductor chip including a fuse map file which indicates individual physical pin locations on the semiconductor chip that correspond to the individual fuse macros within a design of the chip, a fuse blow table correlating the latches on the chip and fuses in the fuse map file, a tester adapted to perform tests on the chip and produce data in the latches, and a fuse blower adapted to blow selected fuses that correlate to the latches having defective data based upon the fuse blow table.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

This invention is directed to automating the process of blowing fuses within a semiconductor device. As discussed above, the conventional manual process of relating physical fuse locations from the chip designer through manufacturing test and into the fuser tool is very time consuming and error prone. This invention automates the entire process, thereby significantly speeding up the system and eliminating human error.

Figure 2:
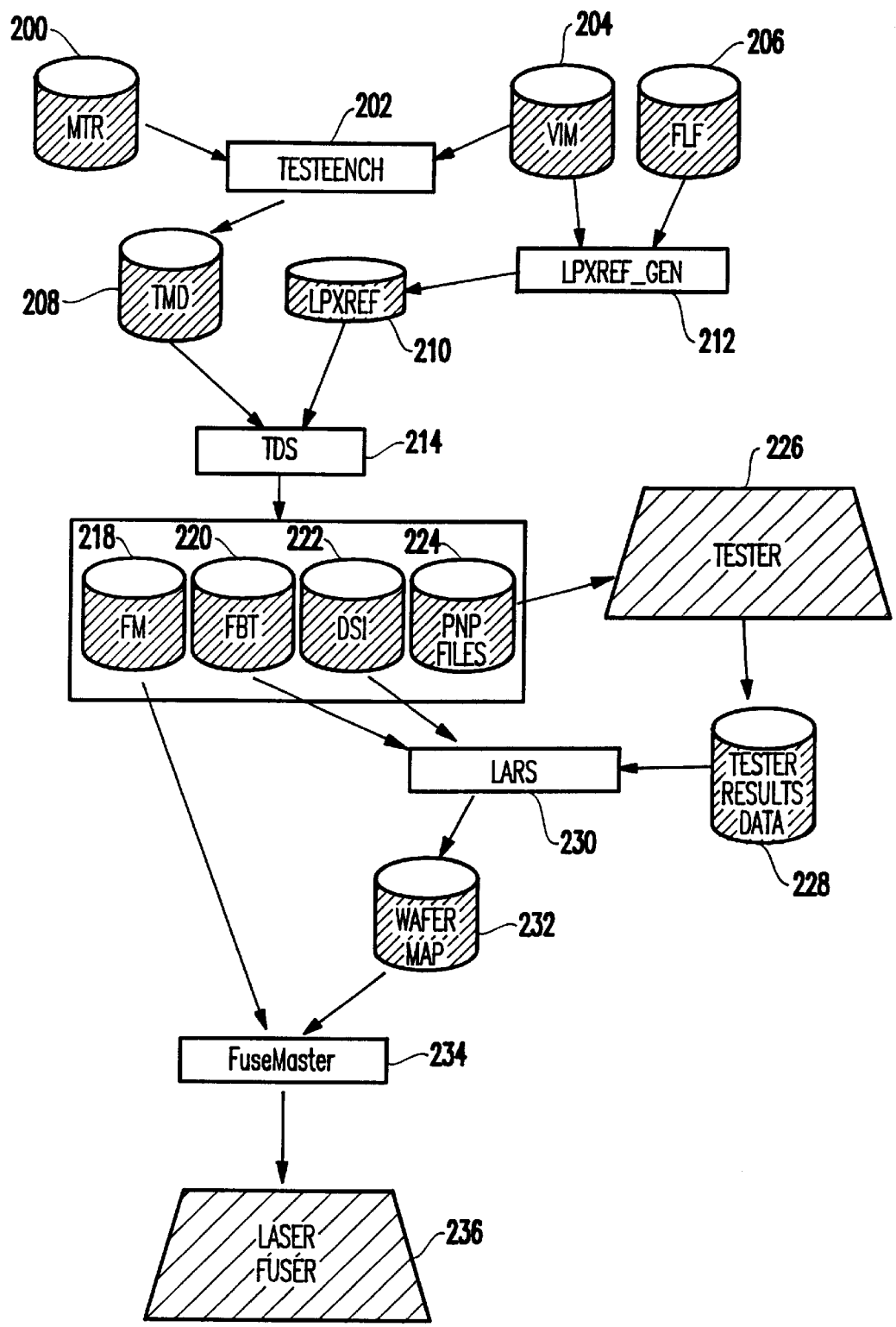
FIG. 2 is a schematic diagram illustrating the inventive system for blowing fuses.

Referring now to the drawings, and more particularly to the flow diagram of FIG. 2, a first embodiment of the inventive fuse-blow automation system is shown. The Very-Large-Scale-Integration (VLSI) In-core Model (VIM) 204 contains the model of an ASIC design which includes a netlist and physical design data (e.g., placement of each cell instance). A Fuse Location File (FLF) 206 is one of the technology rules supplied by the invention for each type of fuse structure (e.g., fuse macros associated with SRAM macros, ECID fuse macro, or fuses within the eDRAM macro).

The ASIC product's logic netlist in the VIM file 204 and the FLF 206 supply information to a logical-to-physical cross-reference file (LPXREF) generator 212 which generates a LPXREF 210. The detailed operation of the LPXREF generator 212 is discussed below with respect to FIGS. 3A–3B.

Test manufacturing data (TMD) 208 is generated for each ASIC product. The TMD 208 includes functional test patterns to run MABIST for SRAMs and BIST for eDRAMs. The TestBench application 202 generates the TMD 208 using the technology specific Macro Test Rule (MTR) 200. The TestBench application 202 provides an isolation solution for the MABIST and BIST designs requiring these macro-test patterns, and then creates the TMD 208 with a sequence of functional test patterns at the product boundary IOs and scan-chain latches.

The MTR 200 defines the required isolation pins, and functional test patterns at the MABIST or BIST design boundary. These functional test patterns initialize the MABIST and BIST controllers, apply clock cycles to run them, and measure the resulting signature to determine if the SRAM and eDRAM macros function correctly. In addition to indicating failing SRAM and eDRAM macros, these patterns also measure data that specifies certain repairs to be made within the SRAM and eDRAM macros through the use of redundant rows and/or columns enabled with laser fuse blow. The TMD 208 and LPXREF 210 are inputs to the Test Data Supply (TDS) software application 214 used to generate the ASIC's manufacturing test data 250.

In the VIM 204, fuse macros are identified by a keyword FUSE_MACRO=YES in their logical cell rules. For each macro that contains fuses, a corresponding FLF exists in the technology library database. The FLF file 206 (associated by naming convention) for a fuse macro contains two sections—begin_instructions and begin_xy_locations. Comments are indicated with an asterisk as the leading character in a record.

The begin_instructions section contains keywords to steer the program. One such keyword is FUSE_ALGORITHM, which is passed into the logical-to-physical reference LPXREF file 210, indicates the type of fail data or fuse algorithm to be used and also indicates to the LPXREF generator software where and what type of net tracing is required.

The begin_xy_locations section contains fuse locations and identification information for fuse macro types requiring chip fuse locations to be recorded in the LPXREF file 210. The fuse locations are specified as xy coordinates (in microns) of the center of the fuse relative to the fuse macro's (0,0) point.

An exemplary FLF for a SRAM fuse macro follows. The latch netname in the MABIST controller of the ASIC matches the name inside the testbench 202 model of the MABIST controller, allowing a correspondence to names generated in the Test Manufacturing Data (TMD).

Exemplary SRAM FLF:

```
begin_instructions
FUSE_ALGORITHM MABIST
end_instructions
begin_xy_locations
* X         Y          Latch Netname in MABIST Controller
*--------   ---------- --------------------------------------------
166.400     70.400     FUSES1_00_RWL0A00.LATCH2
160.000     70.400     FUSES1_01_RWL0A01.LATCH2
...
end_xy_locations
```

An exemplary FLF for an ECID macro follows. The fuses are listed in the order the test software requires (e.g., from the MTR 200). The FLF lists the ID (label) information starting at the last latch in the ECID scan chain and finishing at the first latch in the ECID scan chain. This is because the last latch in the ECID scan chain is the first latch measured during a Level-Sensitive Scan Design (LSSD) scanout operation. The FLF must list the xy coordinates of the fuses in the same corresponding order of latches in the chip-level scan string. As discussed in greater detail below, the LPXREF_GEN program 212 preserves this order.

Exemplary ECID FLF:

```
begin_instructions
FUSE_ALGORITHM ECIDASIC
end_instructions
begin_xy_locations
* X         Y          Label
*--------   ---------- --------------------------------------
88.92       68.90      wafid_c01_01
88.92       75.62      wafid_c01_02
...
end_xy_locations
```

Figure 3A:
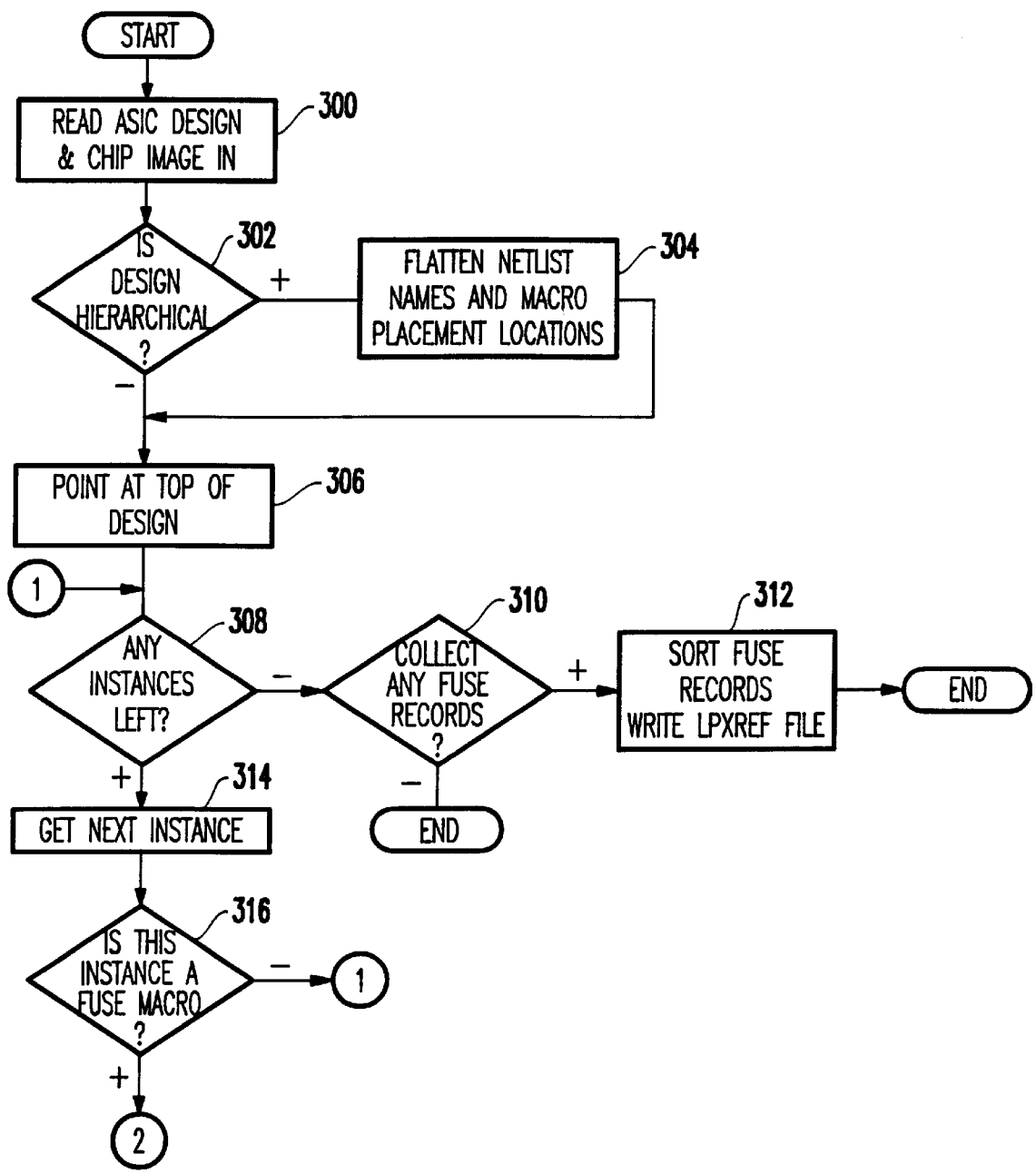
FIGS. 3A and 3B are flowcharts illustrating features of the invention.
Figure 3B:
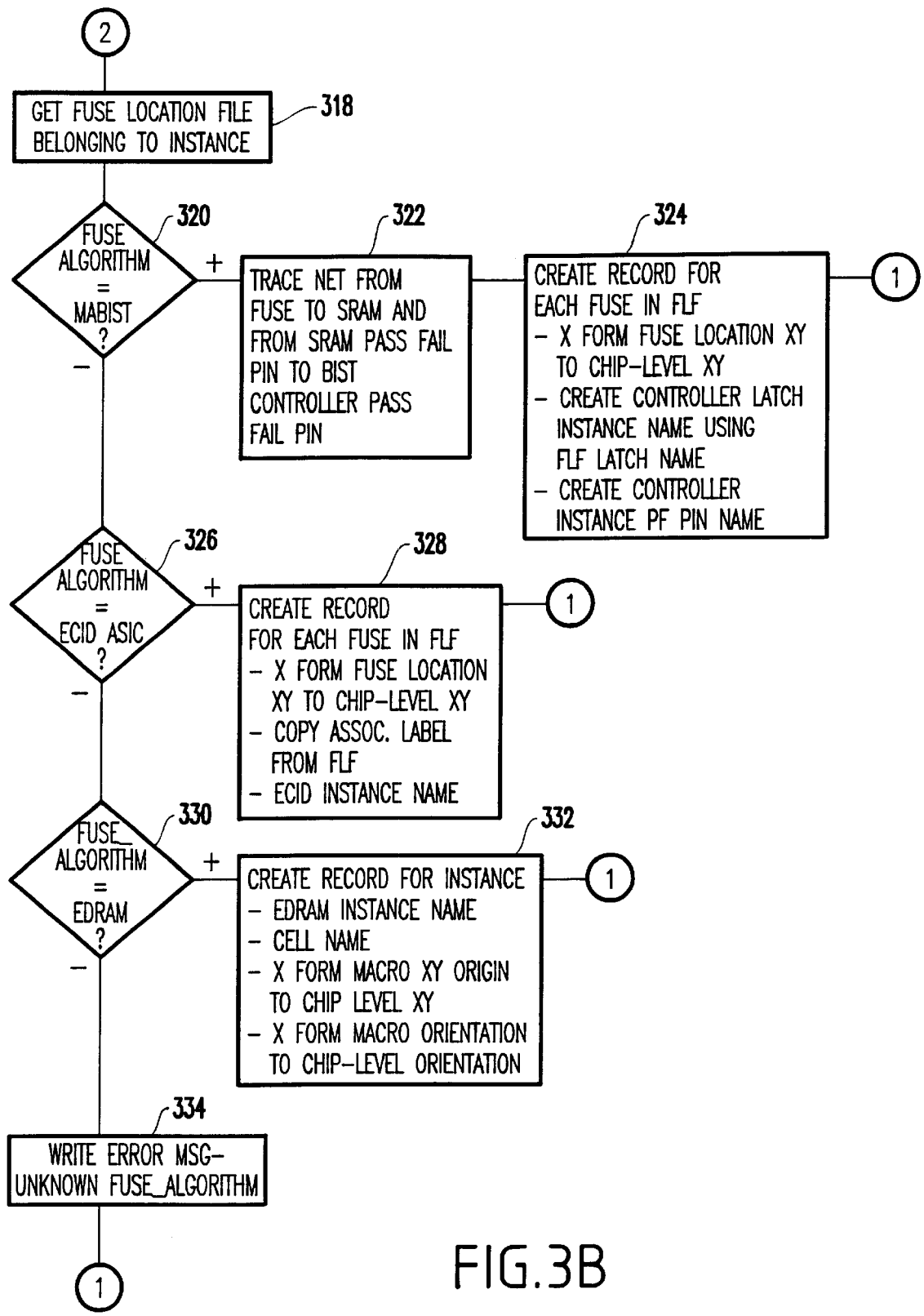

An example FLF file for an eDRAM macro follows:
begin_instructions
FUSE_ALGORITHM EDRAM
end_instructions As shown in FIGS. 3A–3B, the LPXREF_GEN program 212 reads the ASIC design from VIM 204 and any associated FLF files 206 and creates the LPXREF file 210 which contains fuse macro instance data to be related to the TMD 208 in order to automatically blow fuses in manufacturing.

Figure 1:
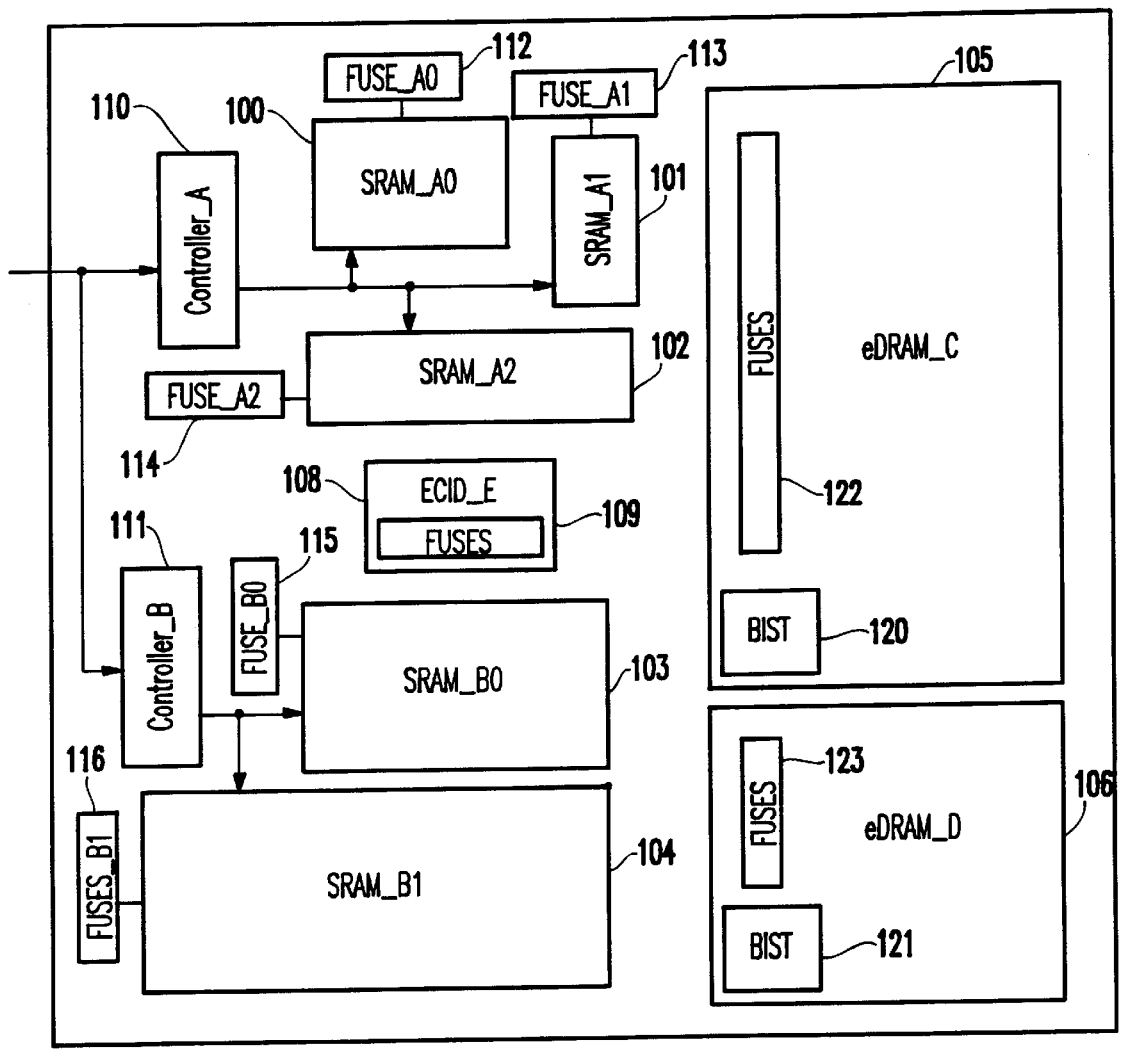
FIG. 1 is a schematic diagram of a ASIC circuit.

There are multiple pass/fail latches in each BIST controller, each having a one-to-one correspondence with an SRAM. However, there is only one set of failing address register (FAR) latches within a MABIST controller. In order to test and collect failing address data for all SRAMs, in the example shown for controller_A 110, in FIG. 1, three MABIST test sequences must be used, one for each SRAM 100, 101, 102. For large, dense SRAMs, redundancy is required to improve yield. In order to optimize the area used on a product by the MABIST controller, the MABIST controller is capable of holding the failing address data for only one SRAM at a time. Therefore, SRAMs sharing a common controller, such as SRAM_A0, SRAM_A1 and SRAMA2, must be tested serially at different points in time. Thus, only one SRAM from each controller can then be tested in parallel to extract the repair information.

Since the FAR latches within the MABIST controller are being measured at different points in time to capture failing address data for all of a MABIST controller's SRAMs, a new solution was required to indicate which set of patterns was testing each SRAM. To provide this solution, during test pattern generation, the invention places a new keyword into the TMD 208 for each SRAM, in order to uniquely identify a MABIST controller's multiple SRAM test patterns. These new keywords are inserted by the MTR 200, for each SRAM on the ASIC.

The value of these keywords specifies which passfail input pin on the MABIST controller is attached to the specific SRAM being tested. In this way the passfail pin information provided in the LPXREF 210, can be correlated to the SRAM test patterns specified in the TMD 208. In the example shown above, SRAM_A0 100 and SRAM_B0 103 would be tested in parallel, since each BIST controller is capable of only storing "failing address register" (FAR) data. This repair data is measured at the tester during an LSSD scanout operation.

In a non-automated approach, the designer of each part needs to be contacted to gather the appropriate part specific information relating failing tester data and the intrepretation of this data to determine which fuses are to be blown and the physical location of those fuses.

Since the same FAR latches are being measured within a shared BIST controller for each SRAM (SRAM_A0 100, SRAM_A1 101, SRAM_A2 102 for Controller A 110 and SRAM_B0 103, SRAM_B1 104 for Controller B 111), the invention improves upon the conventional systems by indicating which MABIST test sequence was testing which SRAMs.

More specifically, to automate the process of collecting the fuse blow data, the MTR 200 for these cells insert keywords into the TMD 208, identifying the BIST controller instance and the pass-fail pin-name for each SRAM being tested in each MABIST test sequence. As discussed below with respect to FIGS. 3A and 3B, during the LPXREF generation process 212, the LPXREF is modified by the invention to include records for each instance of the fuse macros in the BIST controller. These records match the pass-fail pin-name with the data contained in the LPXREF file.

The VIM 204 can be organized in a flat or hierarchical manner. As shown in FIG. 3A, the inventive process begins by reading the ASIC design (as shown in item 300) from the VIM 204. The LPXREF GEN 212 reads the entire ASIC design (including netlist and placement data) into an internal model for processing. The invention then checks to see if the design is hierarchical in item 302 and flattens the netlist of names and macro placement locations as necessary, as shown in item 304.

In a hierarchical design, net names and macro placement information are stored relative to a hierarchical instance (a name that identifies a particular circuit) in the design. However, the fuse blow procedure and manufacturing test processes are performed on a flat full chip basis. To make the correlation between design data and the test/fuse blow data easier, the design is flattened so that the design information is represented using chip level coordinates and chip level net names. After flattening, macro placement data is stored relative to the chip origin instead of the hierarchical instance origin. This flattening is accomplished by translating each circuit instance placement information (x, y, mirror and rotation) to a chip level placement location (x, y, mirror and rotation) taking into account the placement information of the hierarchical instance in which the circuit is placed. Since the chip physical origin is known at the fuse blow tool and the hierarchical instance location is not, this flattening makes it possible to find the fuse location on the chip at the fuse blow station. Chip level net names are used within the test system so flattening the net names allows for correlation of the test net name data to the design net names.

Then, the invention proceeds to the first instance in the design, as shown in item 306. As shown in item 308, the invention performs a loop for each instance of the design. If there are additional instances left, processing proceeds to item 314. In item 316, if the instance is not a fuse macro, processing returns to the beginning of the loop as indicated by item "1". Otherwise, item 316 proceeds, for each instance in the design, to the processing shown in FIG. 3B as indicated by reference "2".

Thus, for each instance which is a fuse macro, the processing shown in FIG. 3B is performed. The processing continues with item 318 where the FLF 206 for each instance is retrieved. The decision boxes 320, 326, 330 allow different processing to occur depending upon whether the fuse algorithm is a multiple array built-in self-test (MABIST) 320, an ECIDASIC 326, or an EDRAM 330.

The LPXREF GEN (212) software uses the value of the fuse algorithm keyword within the FLF to point to different algorithms within the software. This allows the software to perform unique operations based on the value found. Other fuse algorithms are easily added by updating the software to recognize a new fuse algorithm keyword value.

If the FLF includes the statement FUSE_ALGORITHM= MABIST (320), then the invention traces the net from any pin on the fuse macro instance to the SRAM and then traces from the passfail pin on the SRAM to the BIST controller passfail pin, as shown in item 322. This controller passfail pinname is placed into fuse records for each fuse in the corresponding fuse macro, as shown in item 324.

Since the SRAM to fuse macro connection is a single fanout net, the tracing algorithm simply identifies the net attached to the fuse macro instance and finds the name of the SRAM instance that is connected to the other end of the net. Once the SRAM instance is found, a trace from the SRAM to the MABIST is likewise performed, since the SRAM to MABIST net is also a single fanout net.

Then, as shown in item 324, the invention creates a record for each fuse in the FLF by transforming each xy fuse location in the FLF to the chip-level silicon xy coordinates, taking into account the fuse macro's placement location on the chip and mirror and rotation data, as specified in the VIM 204. The FLF 206 includes relative location information of fuses within a given fuse macro. Each fuse macro has its own FLF 206. As mentioned above, the invention converts the fuse location information in each FLF 206 so that the fuse location information is relative to the chip as a whole by noting the fuse macro location, mirroring and orientation. This information is used to create the FMF 218, as discussed below. The details regarding mirror and rotation data are discussed further below with respect to FIGS. 4A and 4B. Additionally, in item 324, the invention appends the controller latch netname specified within the FLF to the flattened VIM's corresponding MABIST controller instance name (separated by a ".") to create a controller instance specific latch netname. In the example shown, FUSE_A0's FLF specifies a controller latch netname of "FUSES1_00_ RWL0A00.LATCH2". As the flattened VIM is traced by the software, FUSE_A0's corresponding MABIST controller is found to have a controller instance name of "Controller_A". The resulting value after the append operation would be:

"Controller_A.FUSES1_00_RWL0A00.LATCH2"

This controller instance specific latch netname value is stored in the first field of the fuse record. The controller instance pass fail pin name is stored in the first field of the fuse record. Additionally, the controller instance specific latch net name value is stored in the second field, and the chip-level fuse x-y coordinates are stored in the third and fourth field, respectively, of the fuse record.

Referring now to item 326, if the FLF includes FUSE_ ALGORITHM=ECIDASIC, then the invention again creates a record for each fuse macro in the FLF by transforming each xy fuse location to the chip-level xy location, again taking into account the ECID macro's placement location, mirror and rotation data, as shown in item 328. Also in item 328, the invention copies the associated label from the FLF and stores the label in the fuse record with the ECID instance name.

Alternatively, in item 330, if the FLF includes FUSE_ ALGORITHM=EDRAM, then, as shown in item 332, the invention creates a record by transforming the macro origin to the chip-level silicon coordinates and transforming the macro mirror and rotation values to an orientation with respect to the chip (a single number from 1 to 8, as discussed below) and stores the same in the fuse record with eDRAM instance name and cell name.

After each record is created in items 324, 328, and 332, processing returns to item 1 in FIG. 3A and, as shown in item 308, the next instance is processed. If decision boxes 320, 326, and 330 do not determine that the instance is a MABIST, ECIDASIC, or EDRAM, then, as shown in item 334, the invention writes an error message that the instance represents an unknown fuse algorithm, and processing returns to item 308.

Once decision box 308 determines that there are no more instances left, decision box 310 determines whether any fuse records were created. If fuse records were created, item 312 sorts the fuse records and writes the LPXREF 210. An example of an LPXREF file for a chip containing all 3 types of fuse macros follows:

```
SECTION MABIST;
/* Controller instance/                                              */
/* pass fail pin name    Controller latch instance name    X    Y    */
/*---------------------  ---------------------------      ----- ----- */
   Controller_A.PF00 Controller_A.FUSES1_00_RWL0A00.LATCH2
1116.40 2011.00;
   Controller_A.PF00 Controller_A.FUSES1_01_RWL0A01.LATCH2
1111.00 2011.00;
   . . .
SECTION ECIDASIC;
/* Note: wafid_c01_01 is always closest to the scan-out pin!         */
/* ECID instance name    ECID label                     X     Y     */
/* -------------------   -------------                 -----  -----  */
ECID_E                   wafid_c01_01       188.92       168.90;
   ECID_E                wafid_c01_02               188.92    175.62;
   . . .
SECTION EDRAM;
/* DRAM instance name   Cell Name       X         Y     Orientation*/
/* --------------------  ------------   -----     -----     ------- */
eDRAM_C                  2MegMacro    4000.00  4000.00        1;
   . . .
```

Figures 4A, 4B:
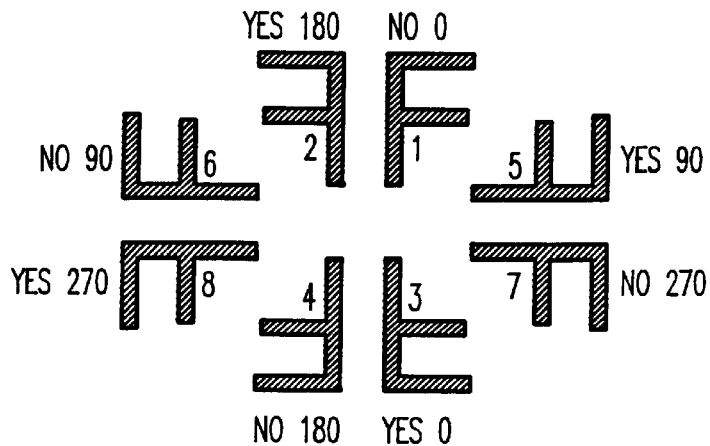
FIGS. 4A and 4B illustrate the rotation and inversion functions of the invention.

As mentioned above, the invention accounts for mirroring and rotation. This orientation process is illustrated in FIGS. 4A–4B. More specifically, FIG. 4A illustrates different orientations 1–8. The invention utilizes up to eight different orientations as shown in FIG. 4B. For example, in orientation 1, the x and y values are changed to +x, +y, no mirroring is performed and no rotation is performed. To the contrary, for example, in orientation 4, the x and y values are changed to −x, −y, again there is no mirroring, however there is 180 degree rotation.

Once the LPXREF 210 is created, the TDS system 214 will extract the appropriate pattern data from the TMD 208 required to test a given logic product. The primary purpose of the TDS system 214 is to translate tester independent patterns generated from the TestBench application 202 and create an output format specific to a given tester platform. The TDS system 214 also creates a DSI (Diagnostic System Interface) file 222 which allows for the translation of failing tester addresses to the TestBench 202 pattern numbers for diagnostic purposes. These patterns, along with level, timings, etc. will be contained within the part number program (PNP) files 224 ultimately shipped to the tester 226. In order to automate the fuse blow process, and in addition to the foregoing, two new files are created by the invention. These new files are the fuse map file (FMF) 218 and the fuse blow table (FBT) 220.

The FMF 218 is created from the fuse X,Y values contained in the LPXREF file. This file format is used directly by the FuseMaster 234 tool to identify where the physical fuses are located on the chip relative to chip design 0,0. The ordering of this file is important since it is also the order in which the fuse string (which fuses to blow) is presented. The TDS system 214 reads the LPXREF file 210 and extracts the fuse X,Y values. The fuse values are arranged in vertical and/or horizontal groups in order to optimize the way the fuse tool travels over the chip. An example FMF file follows illustrating the starting X,Y postion with 20 fuses in each group separated by 6.4 microns in the x direction:

3989.6 3924.8 1* ×6.4 0 20
   3989.6 3952.8 1* ×6.4 0 20
   3208.8 5228.8 1* ×6.4 0 20
   3208.8 5256.8 1* ×6.4 0 20

The FBT 220 is created by joining the information in the LPXREF 210 with the pattern data in the TMD 208. This table indicates how to translate the tester results data with which fuses to blow. Sections within the TMD 208 indicate which patterns are the ones to be used for fuseblow. A special key, "SRAM_PF" supplied by the MTR, is inserted with these patterns which identify the macro(s) being tested by indicating the macro instance name(s). The instance name(s) is the same name that is contained in the first column of the LPXREF file 210. The TDS system 214 matches up the instance name in the TMD with the first column of the LPXREF file.

For MABIST, there is a one-to-one mapping between failing latches and fuses to blow. For this section, the latches being measured in the TMD are also matched against the second column of the LPXREF file thereby creating a latch to fuse correlation in the FBT 220 file.

For EDRAM, the fuses are contained within the eDRAM macro. By knowing the starting pattern and latch contained in the TMD, the failing latch to fuse is known by design and placed in the FBT 220 file.

When the chip reaches the tester, the PNP 224 is run against it to determine if the chip is good, bad, or fixable. It does this by applying the patterns stimulus and response data in the PNP and comparing it to the response of the chip. If the chip is fixable, the failing tester addresses are stored into the test results database 228.

The LARS (Logic Array Redundancy System) application 230 converts the failing tester address data 228 to the parts specific latch data using the DSI file 222. The parts latch data is matched against the latch data contained in the FBT file 220. Once matched up, the data is intrepreted to have the correct fuses blown. For type MABIST, there is a one-to-one relationship between the failing latch and the fuse. For type EDRAM, the failing latch is used to compute the fuse location based on design. The result is a fuse string for each chip on the wafer. Once the results data is collected for each chip, LARS (Logic Array Redundancy System) 230 is run to convert the results for each chip into a fuse string.

The fuse string is simply a string of 0's and 1's for the number of fuses on a given chip, where 1's indicate those fuses which are to be blown. This FMF 218 has the same number and order of fuses as the fuse string. The fuse numbering is ensured since the TDS application 214 creates the FMF 218 and FBT 220 at the same time. This fuse string is then stored in a wafer map database 232 awaiting the fuse blow operation. The wafer includes many chips and the wafer map matches the fuse blow table to a specific chip on the wafer.

When the chips reach the fuse operation, the fuse string, which is chip dependent, and FMF file, which is part number dependent, are retrieved by the fusemaster 234. The chip's appropriate fuses are then blown by the laser fuser 236.

The FMF indicates the physical location of each fuse and the order the fuses will be traversed by the laser tool. The FBT is created at the same time as the FMF and in the same order. In this way, a simple string of logical "1"s and "0"s can be used to control the pulsing of the laser beam itself, as the fuses are being traversed. This string of "1"s and "0"s is created from the test data through the use of the FBT.

Figure 5:
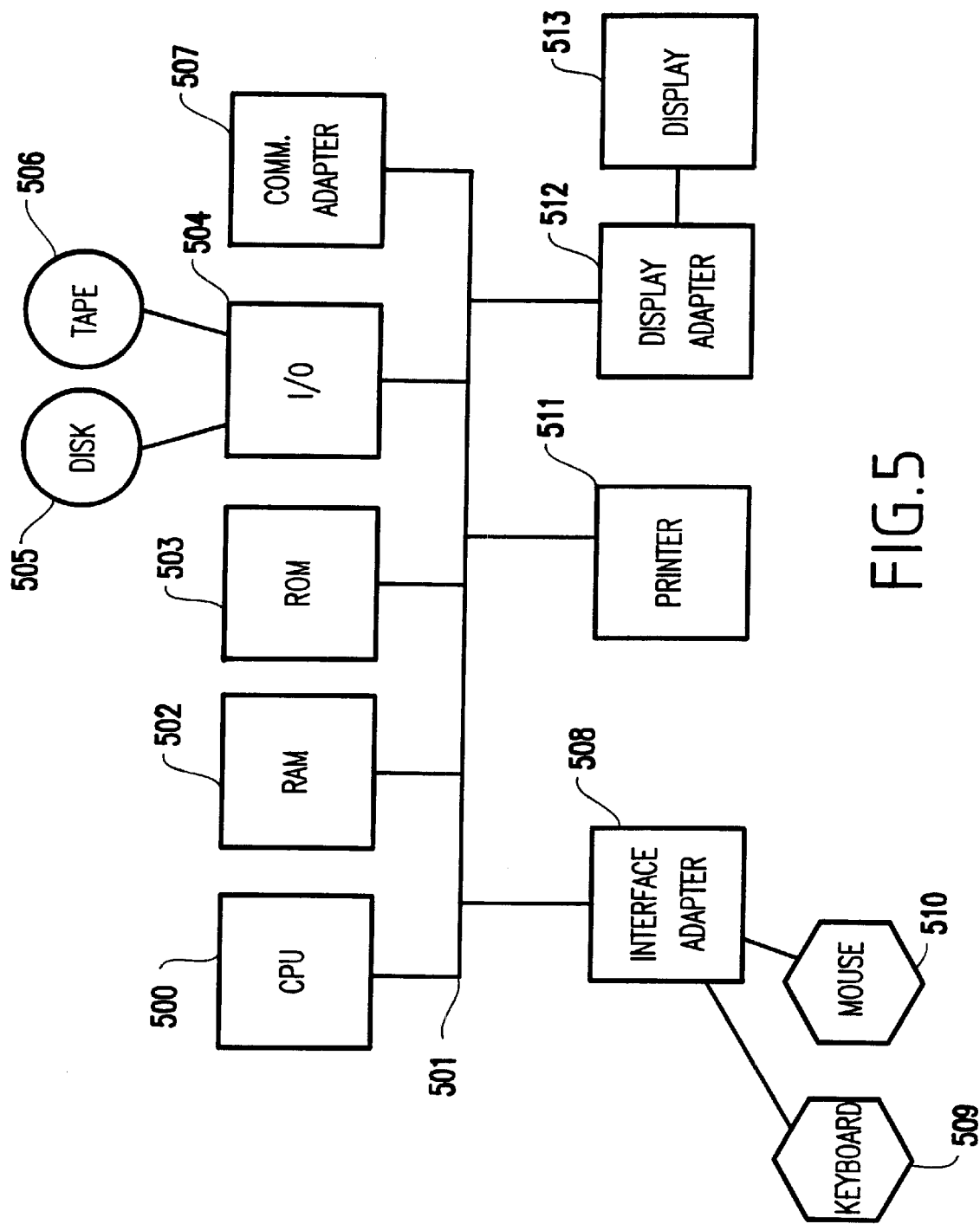
FIG. 5 is a hardware embodiment of the invention.

While the overall methodology of the invention is described above, the invention can be embodied in any number of different types of systems and executed in any number of different ways, as would be known by one ordinarily skilled in the art. For example, as illustrated in FIG. 5, a typical hardware configuration of an information handling/computer system in accordance with the invention preferably has at least one processor or central processing unit (CPU) 500. For example, the central processing unit 500 could include various mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc.

The CPU 500 is interconnected via a system bus 501 to a random access memory (RAM) 502, read-only memory (ROM) 503, input/output (I/O) adapter 504 (for connecting peripheral devices such as disk units 505 and tape drives 506 to the bus 501), communication adapter 507 (for connecting an information handling system to a data processing network) user interface adapter 508 (for connecting peripherals 509–510 such as a keyboard, mouse, microphone, speaker and/or other interface device to the bus 501), a printer 511, and display adapter 512 (for connecting the bus 301 to a display device 313). The invention could be implemented using the structure shown in FIG. 5 by including the inventive method, described above, within a computer program stored on the storage device 505. Such a computer program would act on the circuit data (discussed above with respect to FIG. 2) supplied through the interface units 509–510 or through the network connection 507. The system would then automatically perform the testing and output the fuse blow information on the display 513, through the printer 511 or back to the network 507.

The invention presents a number of advantages when compared to conventional structures. More specifically, the invention is able to identify multiple types of net tracing and fuse blow algorithms, using a consistent description through FLF files and support through the whole process. The use of keywords within the FLF to identify different types of fuse algorithms makes this possible.

Further, the invention relates internal cell-level test model data (latch netnames in controller, ECID labels) to internal cell-level physical design data (fuse xy locations) through FLF files. By relating the test data to the physical data, an automatic algorithm can be employed to translate test related fail data to a physical location on a chip and therefore enable the automatic fuse blow algorithm.

The invention presents an automated method of relating chip-specific test data to design-specific physical data through use of FLFs with chip-level data to create the LPXREF file for each chip and an automated method of inserting keywords into the Test Manufacturing Data (TMD) to identify BIST controller instance and pass-fail pin name for each SRAM being tested on a chip. In addition, the invention provides an automated method of combining VIM physical data with TMD logical data in the LPXREF file. The LPXREF file is provided to the TDS system to create the Fuse Map File and Fuse Blow Table for use by LARS to create a fuse string used by FuseMaster to blow fuses.

Thus, the invention guarantees correctness of the fuse blow data to the fuse blow tool and reduces support and time required for fuse blow capability on per-part number basis by eliminating manual translation of data which could otherwise result in errors. Such errors would cause fuses to be blown incorrectly resulting in non-functional hardware. Non-functional hardware is not sold, and as a result this adds to the overall cost of production.

While the invention has been described in terms of preferred embodiments, those skilled in the art will recognize that the invention can be practiced with modification within the spirit and scope of the appended claims.

What is claimed is:

1. A method of blowing fuses in a semiconductor chip comprising:
   creating a design for said chip using a library;
   generating test data from said design;
   extracting fuse related information from said design to prepare a fuse blow table;
   building said chip with said design data;
   testing said chip to produce failed data;
   comparing said fuse blow table to said failed data to determine fuse blow location data; and
   blowing selected fuses based on said fuse blow location data.

2. The method in claim 1, wherein said extracting includes creating a fuse map file based upon a correlation between physical pin locations on said chip and different fuse macros within said design, and wherein an order of fuses within said fuse blow table matches an order of fuses within said fuse map file.

3. The method in claim 2, wherein said creating of said fuse map file includes categorizing said fuse macros.

4. The method in claim 2, wherein said creating of said fuse map file includes:
   flattening hierarchy in said design; and
   progressively matching fuse macros in said design to said physical pin locations using a fuse location file.

5. The method in claim 4, wherein each fuse macro has a unique fuse location file and said creating of said fuse map file includes converting fuse location information in each fuse location file such that said fuse location information is relative to said semiconductor chip as a whole by noting individual fluse macro location, mirroring and orientation.

6. The method in claim 4, wherein said blowing of selected fuses includes matching said fuse map file to a wafer map.

7. The method in claim 5, wherein said fuse location file includes keywords that identify an associated fuse macro, a type of fuse algorithm to be used with said associated fuse macro and fuse locations relative to a center of said associated fuse macro.

8. A method of testing a semiconductor chip comprising:
   creating a fuse map file based upon a correlation between physical pin locations on said chip and different fuse macros within said design;
   creating a fuse blow table based upon a correlation between latches on said chip and fuses in said fuse map file;
   testing said chip to produce data in said latches;
   matching latches having defective data with fuses using said fuse blow table, wherein defective devices in said chip will produce defective data in said latches; and
   blowing selected fuses based upon said fuse blow table to logically disconnect defective devices from said semiconductor chip.

9. The method in claim 8, wherein an order of fuses within said fuse blow table matches an order of fuses within said fuse map file.

10. The method in claim 8, wherein said creating of said fuse map file includes categorizing said fuse macros.

11. The method in claim 8, wherein said creating of said fuse map file includes:
    flattening hierarchy in said design; and
    progressively matching fuse macros in said design to said physical pin locations using a fuse location file.

12. The method in claim 11, wherein each fuse macro has a unique fuse location file and said creating of said fuse map file includes converting fuse location information in each fuse location file such that said fuse location information is relative to said semiconductor chip as a whole by noting individual fuse macro location, mirroring and orientation.

13. The method in claim 11, wherein said blowing of selected fuses includes matching said fuse map file to a wafer map.

14. The method in claim 12, wherein said fuse location file includes keywords that identify an associated fuse macro, a type of fuse algorithm to be used with said associated fuse macro and fuse locations relative to a center of said associated fuse macro.

15. A system for testing a semiconductor chip comprising:
    a fuse map file indicating individual physical pin locations on said semiconductor chip that correspond to individual fuse macros within a design of said chip;
    a fuse blow table correlating latches on said chip and fuses in said fuse map file;
    a tester adapted to perform tests on said chip and produce data in said latches; and
    a fuse blower adapted to blow selected fuses that correlate to latches having defective data based upon said fuse blow table.

16. The system in claim 15, wherein an order of fuses within said fuse blow table matches an order of fuses within said fuse map file.

17. The system in claim 15, wherein said latches have defective data corresponding to defective devices on said chip.

18. The system in claim 15, wherein each fuse macro has a unique fuse location file.

19. The system in claim 18, wherein said fuse location file includes keywords that identify an associated fuse macro, a type of fuse algorithm to be used with said associated fuse macro, and fuse locations relative to a center of said associated fuse macro.

20. The system in claim 15, wherein said fuse map file includes fuse location information that is relative to said semiconductor chip as a whole, such that said fuse map file takes into account individual fuse macro location, mirroring and orientation.

21. A program storage device readable by machine, tangibly embodying a program of instructions executable by the machine to perform a method of testing a semiconductor chip, said method comprising:

creating a fuse map file based upon a correlation between physical pin locations on said chip and different fuse macros within said design;

creating a fuse blow table based upon a correlation between latches on said chip and fuses in said fuse map file;

testing said chip to produce data in said latches;

matching latches having defective data with fuses using said fuse blow table, wherein defective devices in said chip will produce defective data in said latches; and blowing selected fuses based upon said fuse blow table to logically disconnect defective devices from said semiconductor chip.

22. The program storage device in claim 21, wherein an order of fuses within said fuse blow table matches an order of fuses within said fuse map file.

23. The program storage device in claim 21, wherein said creating of said fuse map file includes categorizing said fuse macros.

24. The program storage device in claim 21, wherein said creating of said fuse map file includes:

flattening hierarchy in said design; and progressively matching fuse macros in said design to said physical pin locations using a fuse location file.

25. The program storage device in claim 21, wherein each fuse macro has a unique fuse location file and said creating of said fuse map file includes converting fuse location information in each fuse location file such that said fuse location information is relative to said semiconductor chip as a whole by noting individual fuse macro location, mirroring and orientation.

26. The program storage device in claim 21, wherein said blowing of selected fuses includes matching said fuse map file to a wafer map.

27. The program storage device in claim 25, wherein said fuse location file includes keywords that identify an associated fuse macro, a type of fuse algorithm to be used with said associated fuse macro and fuse locations relative to a center of said associated fuse macro.

* * * * *